United States Patent
Qian et al.

(10) Patent No.: US 10,587,146 B2
(45) Date of Patent: Mar. 10, 2020

(54) POWER DISSIPATION MONITORING AND LOAD MANAGEMENT

(71) Applicant: Hamilton Sundstrand Corporation, Charlotte, NC (US)

(72) Inventors: Lee Qian, Rockford, IL (US); Joshua C. Swenson, Rockford, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 116 days.

(21) Appl. No.: 15/819,984

(22) Filed: Nov. 21, 2017

(65) Prior Publication Data

US 2019/0157904 A1 May 23, 2019

(51) Int. Cl.
| | |
|---|---|
| *H02J 13/00* | (2006.01) |
| *H02J 1/14* | (2006.01) |
| *H02J 3/14* | (2006.01) |
| *B64D 41/00* | (2006.01) |
| *G01K 7/16* | (2006.01) |
| *G01R 19/00* | (2006.01) |

(52) U.S. Cl.
CPC .......... *H02J 13/0096* (2013.01); *B64D 41/00* (2013.01); *G01K 7/16* (2013.01); *G01R 19/0092* (2013.01); *H02J 1/14* (2013.01); *H02J 3/14* (2013.01)

(58) Field of Classification Search
CPC .. H02J 13/0096; H02J 1/14; H02J 3/14; H02J 13/00; H02J 19/00; G01K 7/16; G01R 19/0092
See application file for complete search history.

(56) References Cited

U.S. PATENT DOCUMENTS

| | | |
|---|---|---|
| 4,135,101 A | 1/1979 | Young et al. |
| 7,589,490 B2 | 9/2009 | Haesters et al. |
| 7,756,669 B2 | 7/2010 | Stancu et al. |
| 9,263,877 B1 | 2/2016 | Kellogg |
| 2017/0141717 A1 | 5/2017 | Winstanley et al. |
| 2018/0348802 A1* | 12/2018 | Teng ...................... G05B 15/02 |

OTHER PUBLICATIONS

Extended European Search Report for European Patent Application No. EP18207478.1, dated Jan. 24, 2019.

* cited by examiner

*Primary Examiner* — Robert L Deberadinis
(74) *Attorney, Agent, or Firm* — Locke Lord LLP; Scott D. Wofsy; Judy R. Naamat

(57) ABSTRACT

A power dissipation monitoring method includes receiving a measurement of current flow through an electrical device and calculating heat dissipation from the electrical device using the current flow measurement. The calculated heat dissipation is displayed on a user interface in real-time with acquisition of the current measurement. Power dissipation monitoring system and electrical load managements systems are also described.

20 Claims, 7 Drawing Sheets

POWER DISSIPATION MONITORING AND LOAD MANAGEMENT

BACKGROUND OF THE INVENTION

1. Field of the Invention

The present disclosure relates to electrical systems, and more particularly to monitoring power dissipation and managing electrical loads based on power dissipation.

2. Description of Related Art

Electrical systems such as in aircraft commonly include electrical loads. The electrical loads are connected to a power source by a power distribution system. The electrical loads generally receive power based on operational requirements, certain electrical loads being turned on/off at a given time according to the needs served by the electrical systems. The electrical power distribution system contains a plurality of electrical distribution devices such as contactors, relays, circuit breakers, and/or solid state power controllers to control the distribution of electrical power from a plurality of electrical sources to a plurality of electrical loads and to protect the system from faults.

The electrical power distribution system commonly includes a number of control units coupled to the electrical distribution devices, a plurality of current and temperature sensors, and to the aircraft avionics. The control units monitor the state of the electrical distribution system and execute the control laws. The electrical power distribution system commonly includes a user interface to inform the users of the state of the electrical distribution system and protective devices and accept commands.

In some electrical systems electrical load management (ELM) is employed within the power distribution controllers to limit the electrical power provided to the electrical loads such that the electrical power demanded by the electrical loads does not exceed the capability of the power source. ELM generally makes load management decisions based on electrical power demand. For example, load shedding can be employed to disconnect electrical loads. This typically relies on present electrical power demand thresholds. The power demand thresholds can be static, i.e., fixed irrespective of operational considerations, or dynamic, i.e. based on operational state of the electrical system. When electrical power demand for a given electrical load exceeds the power demand threshold the load is disconnected. Load management decisions are typically based on gross power demand and not local conditions such as temperature and/or heat dissipation. Additionally, protective actions such as circuit breaker trips and/or overheat protection responses, are generally made without advance warning and without indication of power dissipation in the electrical load.

Such conventional methods and systems have generally been considered satisfactory for their intended purpose. However, there is still a need in the art for improved systems and methods of electrical load management that consider more detailed state information of the power distribution components and which can provide predictive protection capabilities rather than strictly reactive responses. The present disclosure provides a solution for this need.

SUMMARY OF THE INVENTION

A power dissipation monitoring method includes receiving a measurement of current flow through an electrical device and calculating heat dissipation from the electrical device using the current flow measurement. The calculated heat dissipation is displayed on a user interface in real-time with acquisition of the current measurement.

In certain embodiments calculating heat dissipation can include squaring the current flow measurement and multiplying by resistance of the electrical device. The current flow can be a bus current flow through an aircraft power bus. The current flow can be current flow through a circuit breaker, contactor, or a solid-state power controller. Heat dissipation from the electrical device can be calculated using the current measurement. Heat dissipation can be periodically be recalculated for monitoring the temperature. It is also contemplated that the calculated heat dissipation, in conjunction with a thermal model, can be used to predict temperature of the electrical device.

In accordance with certain embodiments, heat dissipation from circuit breakers arranged in a plurality of power panels or remote power distribution units can be calculated to provide total unit dissipation and temperature. The calculated heat dissipation can be communicated to the user interface using an ARIN661 protocol. The user interface can display the calculated heat dissipation. Displaying can include displaying an electrical distribution device indication and control button and real-time power dissipation monitoring button on a user interface. Real-time heat dissipation can be displayed as a percentage of maximum allowable heat dissipation. Real-time heat dissipation can be displayed as a percentage of maximum allowable heat dissipation. Real-time heat dissipation can be displayed with local temperature information for the device generating the heat.

In certain embodiments the accuracy of the calculated heat dissipation and/or calculated electrical device temperature can be improved by a measurement of the temperature surrounding the electrical device. The temperature measurement can be from one or more temperature sensors coupled to the electrical device, module, and/or power panel.

It is contemplated that, in accordance with certain embodiments, the calculated heat dissipation can be compared to a heat dissipation threshold. A determination can be made as to whether the calculated heat dissipation exceeds the heat dissipation threshold. A load management action can be executed when the calculated heat dissipation exceeds the heat dissipation threshold. The load management action can be communicated to the user interface.

A power dissipation monitoring system includes a display, a processor operably connected to the display, and a memory disposed in communication with the processor. The memory includes a non-transitory machine readable medium with instructions recorded on it that, when read by the processor, cause the processor to execute operations of the power dissipation monitoring method described above.

In certain embodiments the system can include a current sensor. The current sensor can be disposed in communication with the processor. The current sensor can be coupled to a circuit breaker or contactor in an aircraft power panel. The current sensor can be coupled to a remote solid-state power controller arranged on an aircraft.

In accordance with certain embodiments the system can include a temperature sensor. The sensor can be disposed in communication with the processor. The temperature sensor can be coupled to a circuit breaker or contactor in an aircraft power panel. The temperature sensor can be coupled to a remote solid-state power controller arranged on an aircraft.

An electrical load management system includes a power dissipation monitoring system as described above. The instructions recorded on the memory further cause the processor to compare the calculated heat dissipation to a heat dissipation threshold, determine whether the calculated heat dissipation exceeds the heat dissipation threshold, and execute a load management action when the calculated heat dissipation exceeds the heat dissipation threshold.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
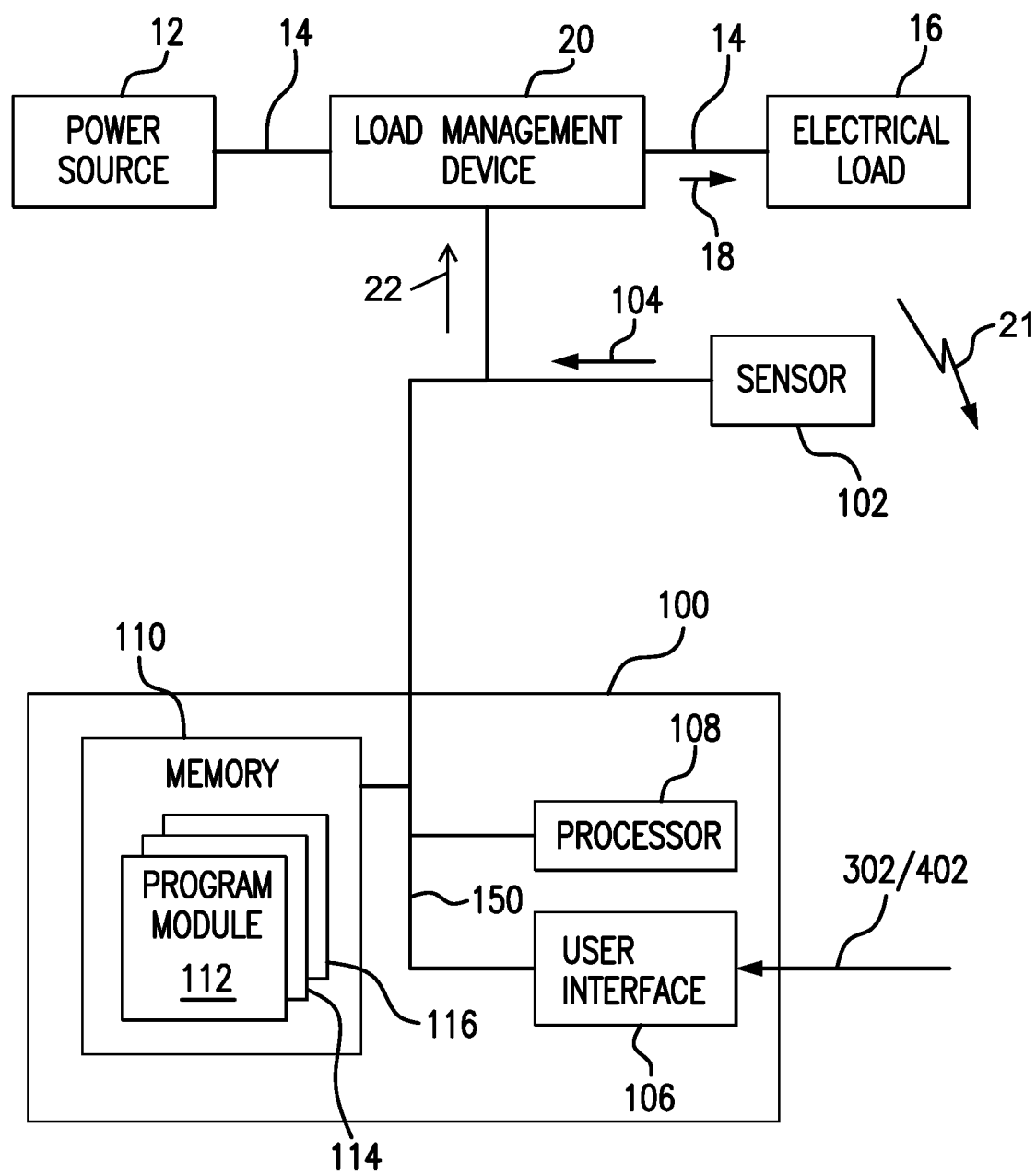
FIG. 1 is a schematic view of an exemplary embodiment of an electrical system constructed in accordance with the present disclosure, showing a power dissipation monitoring system disposed in communication with an electrical load and a load management device.

Reference will now be made to the drawings wherein like reference numerals identify similar structural features or aspects of the subject disclosure. For purposes of explanation and illustration, and not limitation, a partial view of an exemplary embodiment of a power dissipation monitoring system (PDMS) in accordance with the disclosure is shown in FIG. 1 and is designated generally by reference character 100. Other embodiments of power dissipation monitoring systems, methods of monitoring power dissipation, and load management systems in accordance with the disclosure, or aspects thereof, are provided in FIGS. 2-7, as will be described. The systems and methods described herein can be used for monitoring power dissipation and load management in electrical systems, such as in vehicles like aircraft, however the present disclosure is not limited to aircraft or vehicular electrical systems in general.

Referring to FIG. 1, an electrical system 10 is shown. Electrical system 10 includes a power source 12, a power bus 14, and an electrical load 16. Power bus 14 connects power source 12 to electrical load 16 for providing a current flow 18 to electrical load 16. A load management device 20 is arranged between power source 12 and electrical load 16 for selectively providing current flow 18 to electrical load 16. As current flow 18 traverses electrical system 10, electrical system 10 dissipates a portion of electrical power 18 as power dissipation 21, i.e. heat. PDMS 100 is coupled to electrical system 10 via a current sensor 102 and is configured to measure power dissipation 21 from electrical system 10 using a current measurement 104, which sensor 102 provides to PDMS 100. It is contemplated that PDMS 100 be operatively connected to load management device 20 and configured to selectively take load management actions, through a load management signal 22 generated by PDMS 100, and provided to load management device 20 based on power dissipation 21.

PDMS 100 includes a user interface 106, a processor 108, and a memory 110. Processor 108 is operably connected to user interface 106. Processor 108 is disposed in communication with sensor 102, to receive current measurement 104 therefrom, and load management device 20, to relate load management signal 22 thereto. Memory 110 includes a non-transitory machine-readable medium having a plurality of program modules 112 recorded on memory 110. Program modules 112 have instructions that, when read by processor 108, cause PDMS 100 to undertake certain actions. In this respect PDMS 100 includes a power dissipation monitoring module 114 and a load management module 116.

Figure 4:
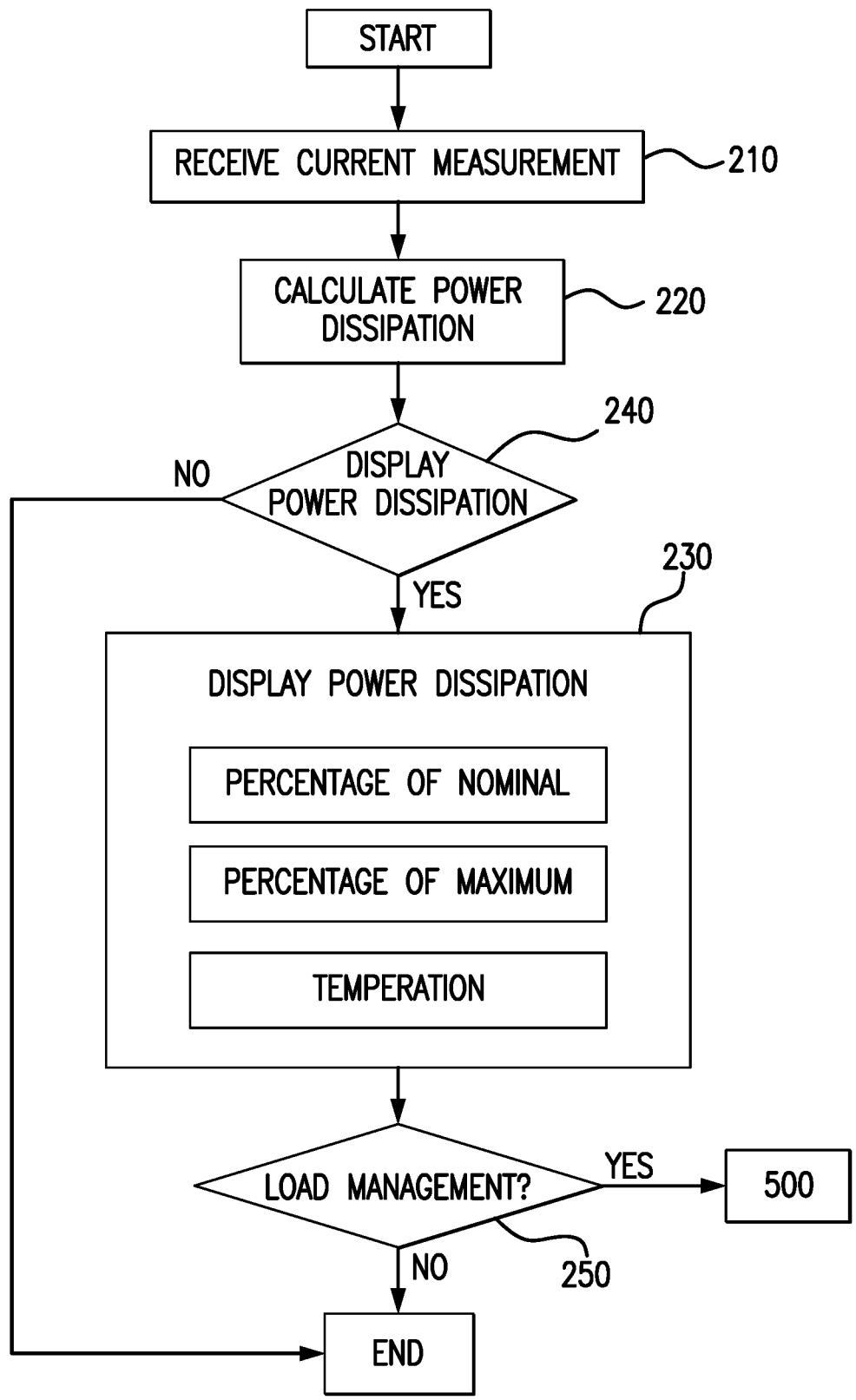
FIG. 4 is a diagram of a method of monitoring power dissipation in the electrical system of FIG. 1, showing steps of the method.

Power dissipation monitoring module 114 includes instructions that cause processor 108 to execute the steps of a power dissipation monitoring method 200 (shown in FIG. 4). In particular, power dissipation monitoring module 114 has instructions that, when executed by processor 108, cause processor 108 to receive measurement of current flow 104 through power bus 14 to electrical load 20 and calculate power dissipation 21 from electrical load 16 using current measurement 104. The instructions recorded on memory 110 also cause processor 108 to display power dissipation 21 from electrical load 16 on user interface 106. In certain embodiments power dissipation 21 is displayed in real-time with the acquisition of current measurement 104. Current measurement 104 can acquired from power bus 14, contactor or switch device 28 or 30 (shown in FIG. 2), SSPC device 50 or 52 (shown in FIG. 2), as appropriate for an intended application.

Load management module 116 includes instructions that cause processor 108 to execute operations for managing electrical loads connected to power source 12 according to a load management method 500 (shown in FIG. 4). In certain embodiments the instructions included in load management module 116 can cause processor 108 to make load managements decisions, such as by executing electrical load management steps. In this respect load management module 116 is operably connected to a load management device 20, e.g., a power panel 26 (shown in FIG. 2) or an SSPC device 50 (shown in FIG. 3), configured to control the flow of current flow 18 to electrical load 16. It is contemplated that the instructions recorded on load management module 116 cause processor 108 to compare calculated heat dissipation to a heat dissipation threshold recorded on memory 110, determine whether the calculated heat dissipation exceeds a predetermined heat dissipation threshold, and execute a load management action when the calculated heat dissipation exceeds the heat dissipation threshold. Examples of load management actions include changing the state of electrical load 16, such as by de-rating electrical load 16 or changing toggling electrical load 16 between an on-state and an off-state.

Figure 2:
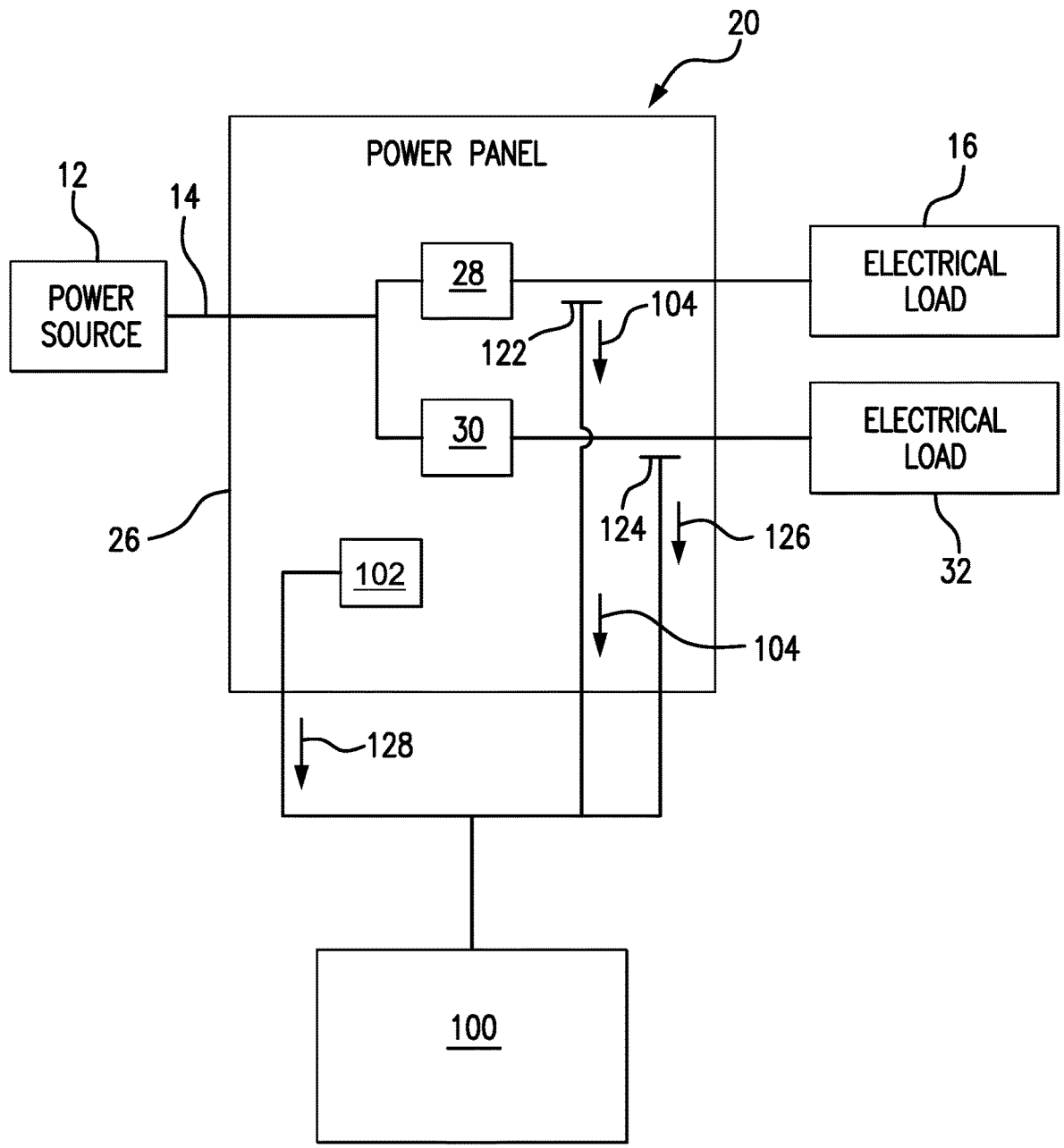
FIGS. 2 and 3 are exemplary embodiments of the electrical system of FIG. 1, showing electrical systems having low management devices with circuit breakers and solid-state power converter (SSPC) devices, respectively.

With reference to FIG. 2, PDMS 100 is shown coupled to electrical system 10 according to a first exemplary embodiment. As shown in FIG. 2 load management device 20 includes a power panel 26. Power panel 26 has a plurality of circuit breaker or contactor devices, e.g., a first circuit breaker or contactor 28 and a second circuit breaker or contactor 30, a plurality of electrical devices, e.g., first electrical load 16 and a second electrical load 32, and a temperature sensor 102. Although described herein as including circuit breakers or contactors, it is to be understood and appreciated that power panel 26 can include one or more solid-state switch devices. Temperature sensor 102 is optional.

Temperature sensor 102 is disposed in communication with PDMS 100 and arranged to provide a temperature measurement 128 to PDMS indicative of temperature within power panel 26 to PDMS 100. It is contemplated that temperature measurement 128 be a local temperature measurement, i.e., indicative of the environment within power panel 26 and common to plurality of circuit breakers or contactors arranged within power panel 26. It is also contemplated that, in certain embodiments, that temperature sensor 102 provide temperature measurement indicative of temperature of one of the plurality of circuit breakers or contactors arranged within power panel 26.

First circuit breaker or contactor 28 is connected to power bus 14 and has an on-state and an off-state. In the on-state first circuit breaker or contactor 28 electrically connects first electrical load 16 to power source 12. In the off-state first circuit breaker or contactor 28 electrically isolates first electrical load 16 from power source 12. A first current sensor 122 is coupled to first circuit breaker or contactor 28 to provide current measurement 104 through first circuit breaker or contactor 28 to PDMS 100 via current measurement 104.

Second circuit breaker or contactor 30 is also connected to power bus 14 and has an on-state and an off-state. In the on-state second circuit breaker or contactor 30 electrically connects second electrical load 32 to power source 12. In the off-state second circuit breaker or contactor 30 electrically isolates second electrical load 32 from power source 12. A second current sensor 124 is coupled to second circuit breaker or contactor 30 to provide a second measurement of current flow 126 through second circuit breaker or contactor 28 to PDMS 100 via current measurement 104. Although two circuit breakers or contactors are shown in the illustrated exemplary electrical system 11 it is to be understood and appreciated electrical system 11 can have more than two circuit breakers or contactors, as suitable for an intended application.

Figure 3:
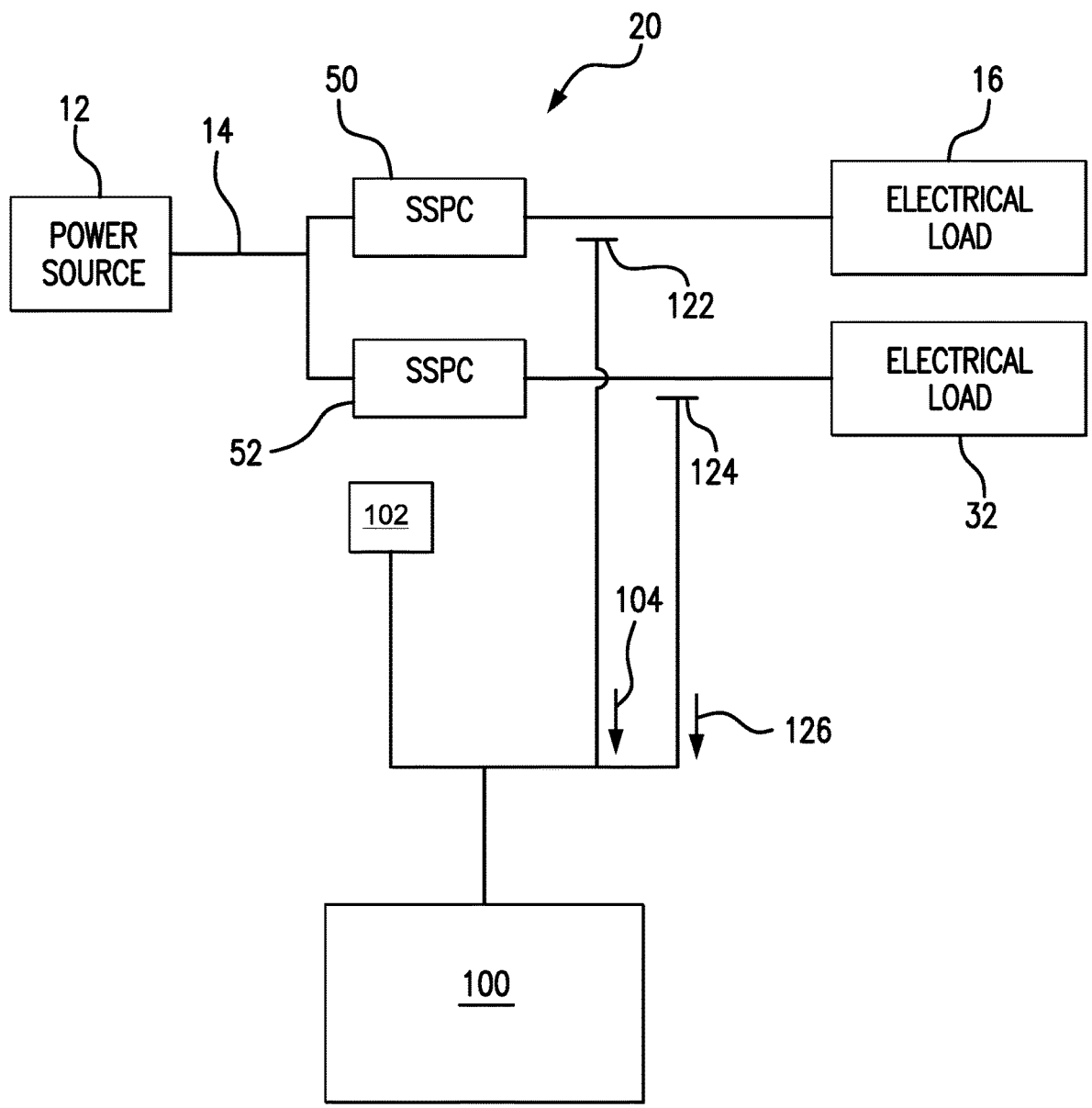

With reference to FIG. 3, PDMS 100 is shown coupled to electrical system 10 according to a second exemplary embodiment. As shown in FIG. 3, load management device 20 includes a load management device 20 having a plurality of solid-state power controller (SSPC) devices, e.g., a first SSPC device 50 and a second SSPC device 52. First SSPC device 50 is operatively connected to a first electrical load 16 and is arranged to selectively provide current flow 18 from power source 12 to first electrical load 16. Second SSPC device 52 is operatively connected to second electrical load 32 and is similarly arranged to selectively provide current flow 18 from power source 12 second electrical load 32.

Temperature sensor 102 is arranged in the environment external to electrical load 16. More specifically, temperature sensor 102 is disposed in communication with PDMS 100 and arranged to provide a temperature measurement 128 to PDMS indicative of temperature on the local environment of the plurality of SSPC devices to PDMS 100 for improving the accuracy of the calculated heat dissipation from electrical load 16. It is contemplated that temperature measurement be a local temperature measurement, i.e., indicative of the environment housing SSPC devices, which can be outside of environmentally controlled space on an aircraft. It is also contemplated that, in certain embodiments, that temperature sensor 102 be arranged to provide temperature measurement indicative of temperature of one of the plurality of SSPC devices.

First SSPC device 50 is connected to power bus 14 and has an on-state, an off-state, and is arranged to throttle current flow to first SSPC device 50. In the on-state first SSPC device 50 electrically connects first electrical load 16 to power source 12, and further throttles current flow thereto (i.e., increases or decreases relative to a nominal value). In the off-state first SSPC device 50 electrically isolates first electrical load 16 from power source 12. First current sensor 122 is coupled first SSPC device 50 to provide current measurement 104 through first SSPC device 50 via current measurement 104.

Second SSPC device 52 is also connected to power bus 14 and has an on-state, an off-state, and is similarly arranged to throttle current flow to second electrical load 32. In the on-state second SSPC 52 electrically connects second electrical load 32 to power source 12 and further throttles current flow thereto. In the off-state second SSPC device 52 electrically isolates second electrical load 32 from power source 12. Second current sensor 124 is coupled second SSPC device 52 to provide a second measurement of current flow 126 through second SSPC device 52 to PDMS 100 via current measurement 104. Although two SSPC devices are shown in the illustrated exemplary electrical system 10, it is to be understood and appreciated load management device can include a single SSPC device or more than two SSPC devices, as suitable for an intended application.

With reference to FIG. 4, a method 200 of monitoring power dissipation in an electrical system, e.g., electrical system 10 (shown in FIG. 1), is shown. Method 200 generally includes receiving a measurement of current flow, e.g., current flow 18 (shown in FIG. 1), through an electrical device, e.g., electrical load 16 (shown in FIG. 1), as shown with box 210. Power dissipation from the electrical device is calculated using the current flow measurement, as shown with box 220. Power dissipation can be calculated by squaring the current flow measurement and multiplying by resistance of the electrical device. The power dissipation calculated with the current measurement is displayed on a user interface, e.g., user interface 106 (shown in FIG. 1), as shown with box 230. It is contemplated that the power dissipation can be displayed in real-time, i.e., at substantially the same time that the current measurement is acquired.

The calculated power dissipation can be communicated to the user interface using an ARIN661 protocol. For example, PDMS 100 (shown in FIG. 1) can be disposed in communication with user interface 106 (shown in FIG. 1) via an ARIN661 communications bus 150 (shown in FIG. 1). As will be appreciated by those of skill in the art in view of the present disclosure, communicating via an ARIN661 protocol allows for implement method 200 to an existing aircraft architecture with relatively minor modification to an aircraft hardware and software configuration, facilitating upgrading legacy aircraft with power dissipation monitoring capabilities. It also allows incorporating existing sensors, e.g., current and temperature sensors, already in place in an existing aircraft to provide current measurement and temperature measurements for PDSM 100 (shown in FIG. 1) and method 200.

It is contemplated that the current flow measurement can be a bus current flow, e.g., power bus 14 (shown in FIG. 1), through an aircraft power bus. The current measurement can be representative of current flow through a circuit breaker or contactor, e.g., through first circuit breaker of contactor 28 (shown in FIG. 2) and/or second circuit breaker or contactor 30 (shown in FIG. 2). It is also contemplated that temperature of the electrical device can be calculated using the current measurement, which reduces the need for instrumentation in load management device 20 to determine temperature.

Figure 5:
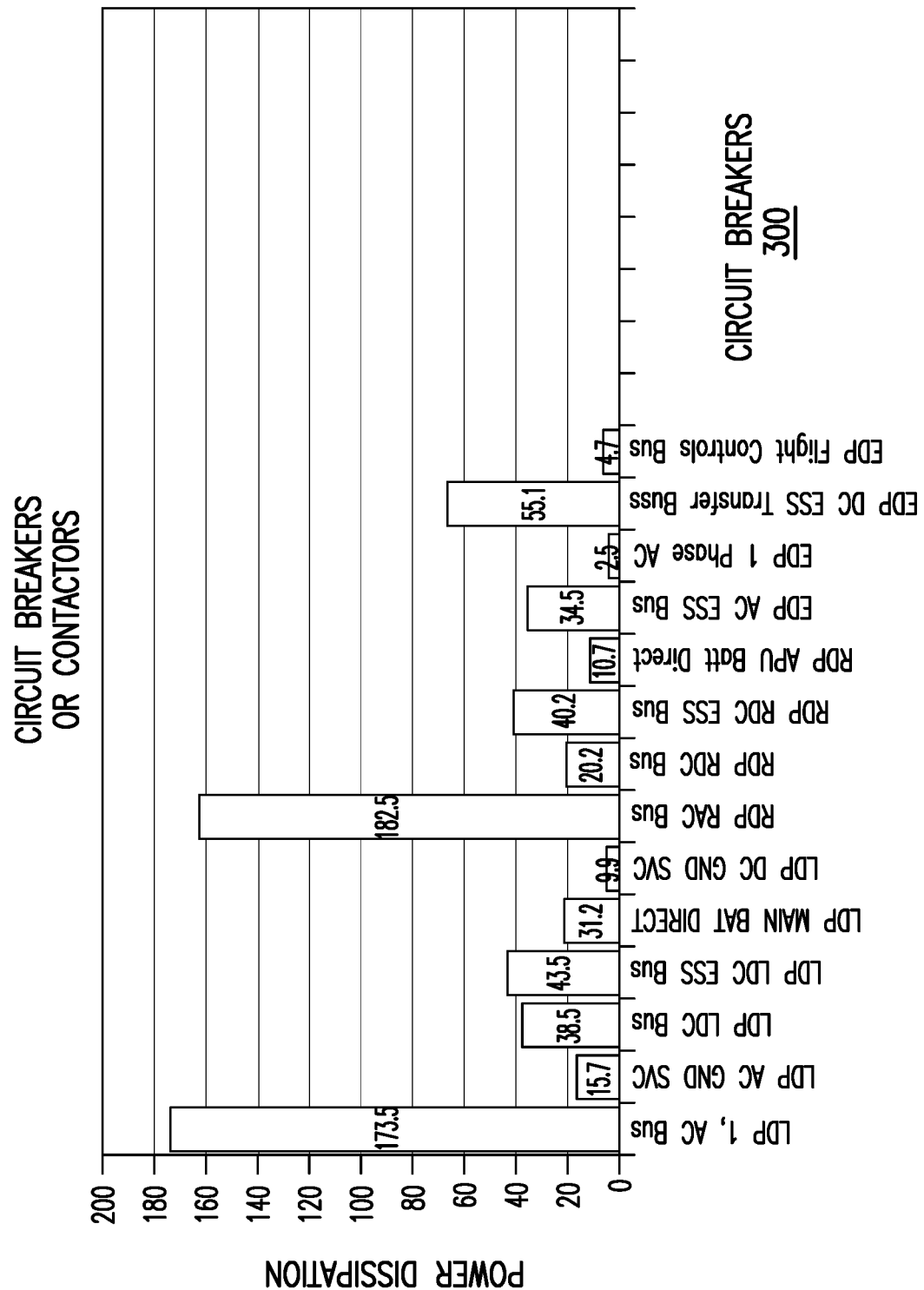
FIGS. 5 and 6 are power dissipation monitoring charts displayed by the power dissipation system of FIG. 1, showing power dissipation in a power panel and remote SSPC devices of an aircraft electrical system, respectively.

In certain embodiments, power dissipation from contactors or circuit breakers arranged in a power panel, e.g., power panel 26 (shown in FIG. 2), can be displayed on a user interface. For example, as shown in FIG. 5, power dissipation from circuit breakers or contactors (or modules and/or sub-modules) can be displayed on a common graph 300. In the illustrated exemplary display specific circuit breakers or contactors appear on the x-axis and power dissipation is shown on the y-axis. Display of power dissipation by user interface 106 (shown in FIG. 1) provides prognostic diagnostic information a user through display, in relative terms, of power dissipation of devices prior to circuit breakers or contactors disconnecting elements or automatic load shedding to occur because of elevated power dissipation. It is contemplated that graph 300 can be manually displayed via user input, e.g., via receipt of a user input 302 (shown in FIG. 1) at user interface 106, as shown in FIG. 4 by decision box 240.

Figure 6:
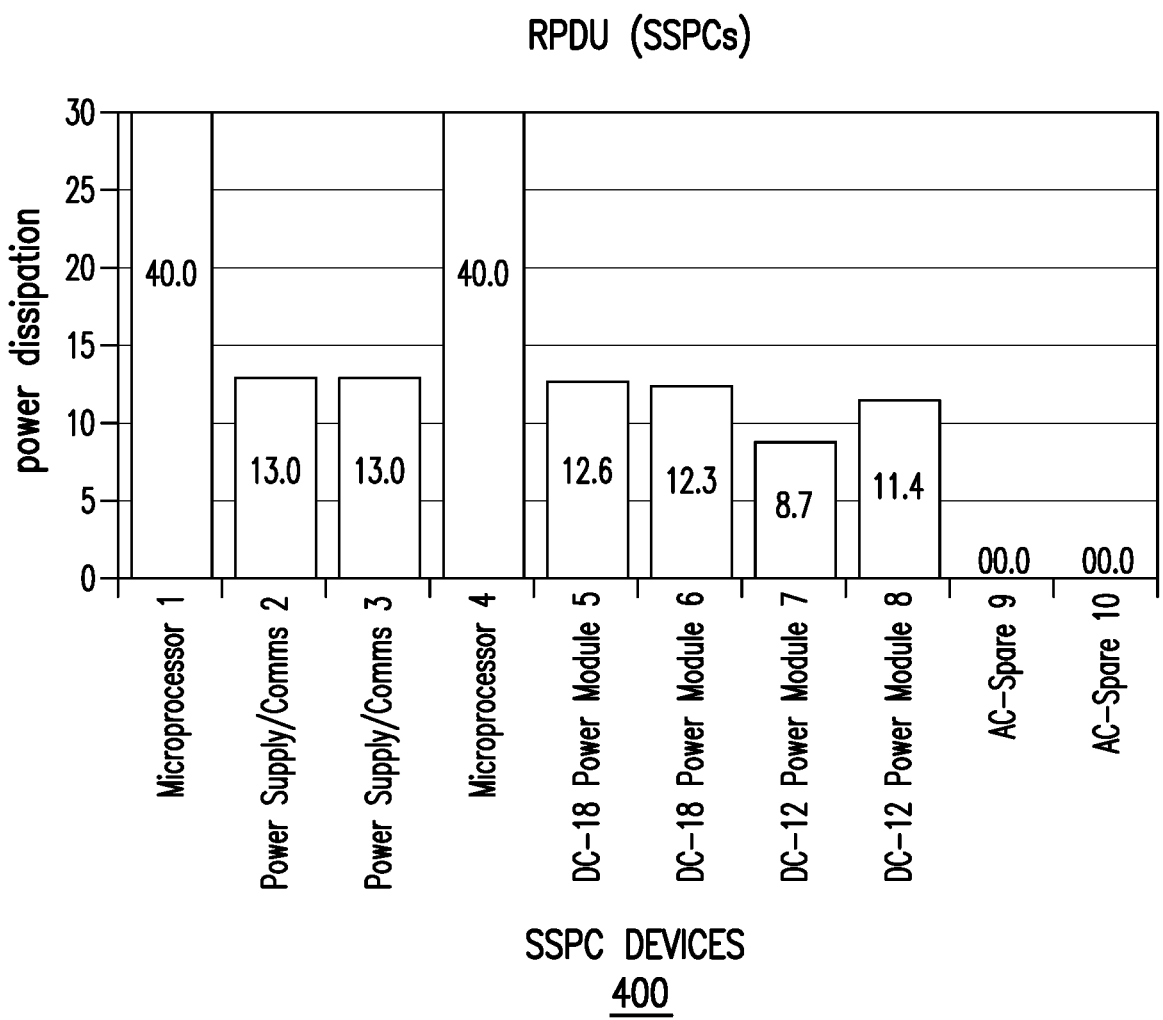

In accordance with certain embodiments, power dissipation from a plurality of remote power drive units, e.g., first SSPC device 50 (shown in FIG. 3) and/or second SSPC device 52 (shown in FIG. 3), can be displayed. For example, as shown in FIG. 6, power dissipation from SSPC devices can be displayed on a common graph 401. In the illustrated exemplary user interface 106 (shown in FIG. 1) displays power dissipation for selected SSPC devices, identified on the x-axis of graph 401, on the y-axis of graph 401. As will be appreciated by those of skill in the art in view of the present disclosure, presenting power dissipation for SSPC devices on user interface enables PDMS 100 (shown in FIG. 1) to provide diagnostic information in advance of an SSPC device disconnecting or de-rating an electrical load controlled by a given SSPC device. It is contemplated that graph 401 can be also be manually displayed through a user input 402 (shown in FIG. 1) received at user interface 106, as shown by decision box 240 (shown in FIG. 4).

As shown in FIGS. 5 and 6, the power dissipation can be displayed as a percentage of maximum allowable power dissipation 350 or maximum power dissipation 450. The power dissipation can be displayed as a percentage of maximum allowable power dissipation 360 or maximum power dissipation 460. It is also contemplated that the power dissipation can be displayed with local temperature information for the device, e.g., circuit breaker or contactor and/or SSPC device, generating the heat.

Figure 7:
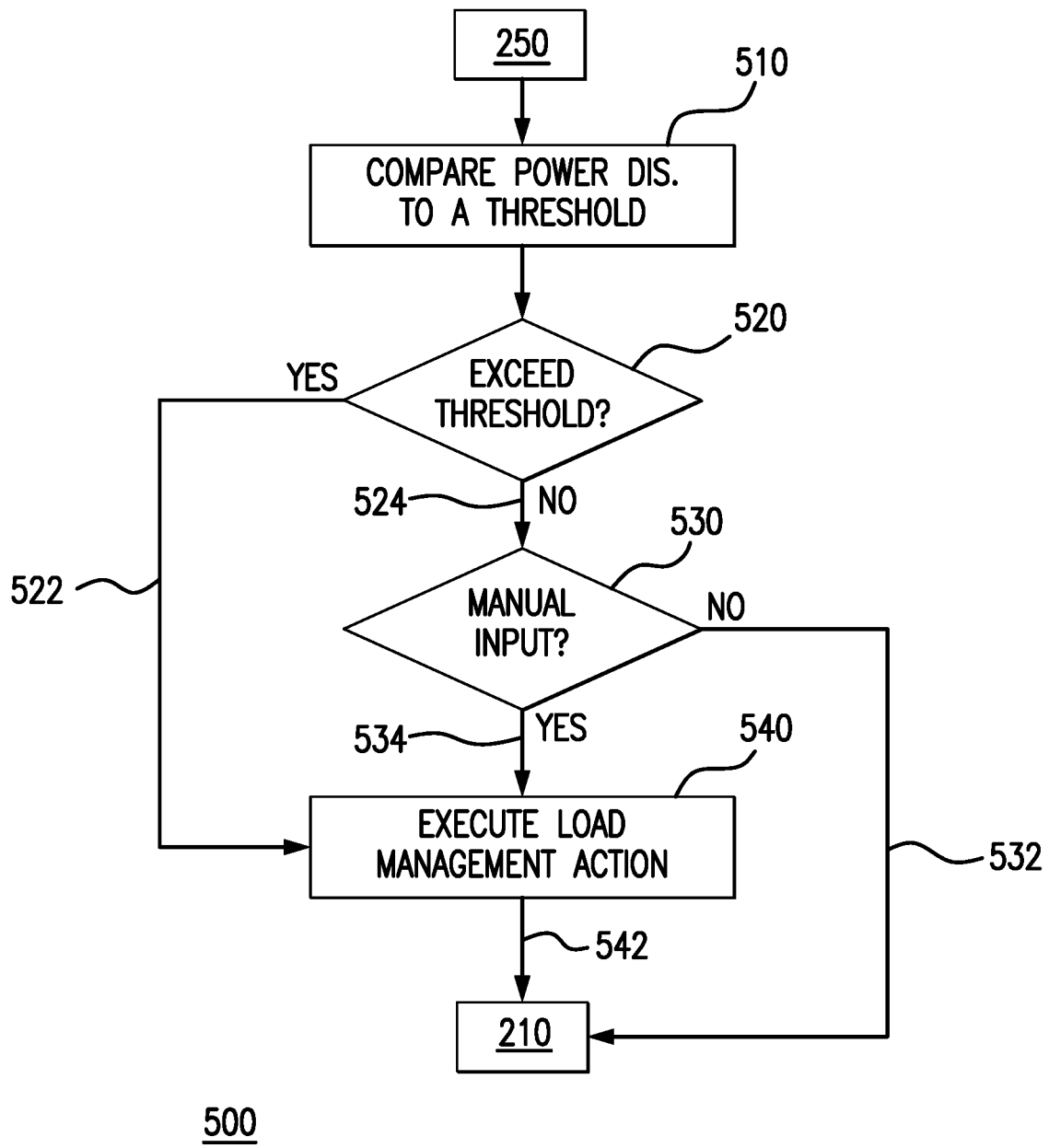
FIG. 7 is a diagram of load management operations of the method of FIG. 4, showing operations for manually and automatically shedding load based on power dissipation in an electrical system.

With references to FIGS. 4 and 7, it is contemplated that the method 400 can include a load management. In particular, the calculated power dissipation value can be provided to load management module 116 (shown in FIG. 1), as shown by decision box 250.

The calculated power dissipation can be compared to a power dissipation threshold, as shown by box 510. When the comparison indicates that the calculated power dissipation exceeds the power dissipation threshold a load management action can be executed, as shown by arrow 522 and box 540. When the comparison indicates that the calculated power dissipation does not exceed the power dissipation threshold the load management method looks for a manual input, as shown by decision box 530. If a manual input has been received, e.g., at user interface 106 (shown in FIG. 1), the load management action can be executed, as shown by arrow 534 and box 540. If no manual input has been received power dissipation monitoring continues, as shown by arrow 532.

With the advent of the 'more electric' aircraft and the proliferation of electrical device the health of aircraft electric system and devices connected to the electrical system during flight has become increasingly important. In conventional electrical systems aircrew are generally unaware of electrical system anomalies until circuit breaker trips or overheat protection actions are executed. Electrical systems also typically do not report whether the cause of a circuit breaker trip or overheat protection action is the result of high current on a contactor or a circuit breaker, or whether there is a component failures on the electrical device connected to the circuit breaker or contactor. Moreover, aircrew are typically unaware of unaware of incipient increases in power dissipation (and associated heat generation), and can therefore be unaware of such conditions until sustained operation with elevated levels of power dissipation causes device degradation, unexpected CB trips, circuit failures or creates a fire hazard.

In embodiments described herein systems and method of monitoring power dissipation are provided. In certain embodiments, real-time power dissipation is calculated using current measurements acquired from the electrical system power bus. It is contemplated that the real-time power dissipation be calculated by squaring the current measurement and multiplying by the resistance of the electrical device (s) connected to the power bus to determine the respective heat generation contributions of the electrical devices and loads. In accordance with certain embodiments, the power dissipation is provided to a user interface in relational context that makes apparent the user abnormal power dissipation from an electrical device.

In certain embodiments the methods and systems described herein utilize current measurements acquired using sensors for real-time protections schemes. The current flow information can be combined with state information, e.g., wherein a given circuit breaker or contractor, to determine the current flow throughout a power panel. The state information, current flow, and electrical device can be used to predict power losses in real-time. Similarly, real-time current measurements from SSPC devices can be combined with resistances to predict SSPC power dissipation in real-time. The SSPC device power dissipation can be summed to calculate total module losses and total unit losses, as suitable for the arrangement of a given electrical system.

The power dissipation monitoring methods and systems of the present disclosure, as described above and shown in the drawings, provide for electrical systems with superior properties including improved availability of electrical system health information and the capability of the flight crew to take pre-emptive action when the electrical system is acting abnormally and prior to protective trips taking place. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A power dissipation monitoring method, comprising:
receiving a measurement of current flow through an electrical device, the current flowing from a power source through the electrical device to an electrical load;
calculating heat dissipation from the electrical device using the current flow measurement; and
displaying the calculated heat dissipation on a user interface, wherein the heat dissipation is displayed in real-time with acquisition of the current measurement.

2. The method as recited in claim 1, wherein calculating heat dissipation includes squaring the measurement of current flow and multiplying by resistance of the electrical device.

3. The method as recited in claim 1, further comprising communicating the calculated heat dissipation to the user interface using an ARIN661 protocol.

4. The method as recited in claim 1, wherein the electrical device is an aircraft power bus.

5. The method as recited in claim 1, wherein the electrical device is a circuit breaker, a contactor, or a remote electrical device controller by a solid-state power controller.

6. The method as recited in claim 2, further comprising measuring temperature of the environment surrounding the electrical device.

7. The method as recited in claim 1, wherein displaying includes displaying a circuit breaker indication and control button and real-time power dissipation monitoring button on a user interface.

8. The method as recited in claim 7, further comprising displaying at least one of (a) real-time heat dissipation as a percentage of maximum allowable, (b) real-time power loss, and (c) local temperature.

9. The method as recited in claim 1, wherein displaying includes displaying heat dissipation from a plurality of electrical devices, wherein the electrical devices are circuit breakers arranged in a power panel or displaying heat dissipation from a plurality of electrical devices, wherein the electrical devices are remote power drive units (RPDUs).

10. The method as recited in claim 9, further comprising displaying at least one of (a) real-time heat dissipation as a percentage of maximum allowable, (b) real-time power loss, and (c) local temperature.

11. The method as recited in claim 1, further comprising:
comparing the calculated heat dissipation to a heat dissipation threshold;
determining whether the calculated heat dissipation exceeds the heat dissipation threshold; and
executing a load management action when the calculated heat dissipation exceeds the heat dissipation threshold.

12. The method as recited in claim 11, further comprising communicating the load management action to the user interface.

13. The method as recited in claim 1, further comprising calculating temperature of the electrical device using the current measurement.

14. A power dissipation monitoring system, comprising:
a display;
a processor operably connected to the display;
non-transitory machine-readable medium in communication with the processor and having instructions recorded on it that, when read by the processor, cause the processor to:
receive a measurement of current flow through an electrical device, the current flowing from a power source through the electrical device to an electrical load;
calculate heat dissipation from the electrical device using the current flow measurement; and
display the calculated heat dissipation on a user interface, wherein the heat dissipation is displayed in real-time with the current measurement.

15. The system as recited in claim 14, further comprising a current sensor disposed in communication with the processor, the current sensor providing the measurement of current flow.

16. The system as recited in claim 15, wherein the current sensor is coupled to the electrical device and the electrical device is a circuit breaker or contactor in an aircraft power panel or a remote solid-state power controller arranged on an aircraft.

17. The system as recited in claim 14, further comprising a temperature sensor disposed in communication with the processor.

18. The system as recited in claim 14, further comprising a user interface disposed in communication with the processor.

19. The system as recited in claim 14, wherein the instructions recorded on the memory further cause the processor to:
comparing the calculated heat dissipation to a heat dissipation threshold;
determining whether the calculated heat dissipation exceeds the heat dissipation;
executing a load management action when the calculated heat dissipation exceeds the heat dissipation threshold; and
calculating temperature of the electrical device using the current measurement.

20. An electrical load management system, comprising:
a power dissipation monitoring system as recited in claim 14, wherein the instructions recorded on the memory further cause the processor to:
compare the calculated heat dissipation to a heat dissipation threshold;
determine whether the calculated heat dissipation exceeds the heat dissipation threshold; and
execute a load management action when the calculated heat dissipation exceeds the heat dissipation threshold.

* * * * *